US005524095A

United States Patent [19]
Someya et al.

[11] Patent Number: 5,524,095
[45] Date of Patent: Jun. 4, 1996

[54] SEMICONDUCTOR MEMORY DEVICE WITH A SUBSTRATE BIAS VOLTAGE GENERATION CIRCUIT AS A POWER SUPPLY OF A WORD LINE DRIVER CIRCUIT

[75] Inventors: Tadashi Someya, Tokyo; Masami Masuda, Yokohama; Satoru Hoshi, Kawasaki, all of Japan

[73] Assignee: Kabushiki Kaisha Toshiba, Tokyo, Japan

[21] Appl. No.: 388,984

[22] Filed: Feb. 15, 1995

[30]     Foreign Application Priority Data

Feb. 16, 1994  [JP]  Japan ................................. 6-019532

[51] Int. Cl.⁶ ..................................................... G11C 7/00
[52] U.S. Cl. ........................... 365/189.09; 365/230.06
[58] Field of Search .............................. 365/189.09, 226, 365/230.06; 327/534

[56]     References Cited

U.S. PATENT DOCUMENTS 5,376,840  12/1994  Nakayama ............................. 365/226
5,394,365  2/1995  Tsukikawa ........................ 365/189.09

*Primary Examiner*—David C. Nelms
*Assistant Examiner*—Son Dinh
*Attorney, Agent, or Firm*—Loeb & Loeb

[57]     ABSTRACT

In a CMOS type static RAM, a substrate bias voltage VPP higher than a power supply voltage supplied from an outer unit is supplied to an N type substrate region of a PMOS transistor of a CMOS inverter forming a word line driving circuit to bias the N type substrate region to the bias voltage VPP and to a power supply terminal of the CMOS inverter as a power supply voltage. Whereby, resistance of storage data to incidence of radioactive rays is increased just after writing to a storage node of a memory cell is ended, and a soft error generation rate can be easily reduced.

5 Claims, 9 Drawing Sheets 5,524,095

1

SEMICONDUCTOR MEMORY DEVICE WITH A SUBSTRATE BIAS VOLTAGE GENERATION CIRCUIT AS A POWER SUPPLY OF A WORD LINE DRIVER CIRCUIT

BACKGROUND OF THE INVENTION

1. Field of the Invention

The present invention relates to a semiconductor memory device, and more particularly to a word line driving circuit of a static random access memory (SRAM) of a CMOS type.

2. Description of the Related Art

An SRAM cell has been known and a CMOS inverter has been often used as a word line driving circuit for driving a word line connected to the memory cell.

FIG. 9 shows a part of a conventional SRAM cell.

In FIG. 9, reference numeral 91 is a memory cell provided in a SRAM, D1, /D1: a pair of complementary bit lines connected to the memory cell 91, WL1: a word line connected to the memory cell 91, 92: a word line driving circuit formed of a CMOS inverter connected to the word line WL1, and 93: a row decoder for decoding an input of an row address to control the word line driving circuit 92.

The memory cell 91 comprises a flip-flop circuit having two inverters, which are cross-connected, and a pair of MOS transistors T11 and T12 for a transfer gate. The inverters comprise enhancement type MOS transistors T13 and T14 for driving and high resistance elements R11 and R12 for load. One end of each of the MOS transistors T11 and T12 is connected to each of a pair of complementary storage nodes a1 and b1 of the flip-flop circuit. The other end of each of the MOS transistors T11 and T12 is connected to each of the paired bit lines D1,/D1, and a gate is connected to the word line WL1 in common.

The MOS transistors T11 and T12 for a transfer gate are turned on or off in accordance with a logic level of the word line WL, respectively, in order to control data transfer among the storage node a1 of the flip-flop circuit, the bit line D1, the storage node b1, and the bit line /D1.

The CMOS inverter 92 for word line driving comprises a PMOS transistor T15 in which a source and a substrate region are connected to a power supply voltage (VDD) node, and an NMOS transistor T16 in which a source and a substrate region are connected to a ground voltage (VSS) node. Gates of both transistors T15 and T16 are mutually connected to each other, and serve as an input node, and drains of both transistors T15 and T16 are mutually connected to each other, and serve as an output node.

FIG. 10 shows an example of the cross sectional structure of both transistors T15 and T16 of the CMOS inverter 92.

In the figure, reference numeral 100 is a semiconductor substrate, 101: an N⁻ type N well (substrate region of PMOS transistor T15), 102: an N⁺ type electrode region of the N well 101, 103a, 103b: P⁺ type impurity regions (source and drain of PMOS transistor T15), 104: a P⁺ type electrode region of a P well (substrate region of NMOS transistor T16), 106a, 106b: N⁺ type impurity regions (source and drain of NMOS transistor T16), 107: an insulation gate film, 108: a gate electrode of PMOS transistor T15, and 109: a gate electrode of NMOS transistor T16.

FIG. 11 is a circuit diagram showing an example of a buffer circuit 110 for writing data to the bit lines D1 and /D1.

FIG. 12 shows an example of a waveform of each node in a writing operation to the memory cell 91 of FIG. 9.

2

It is assumed that the pair of storage nodes a1 and b1 of the flip-flop circuit of the memory cell 91 are set to an "L" level (VSS)/"H" level (VDD), respectively, in the initial state. In this case, a writing enable signal /WE to be inputted to the buffer circuit 110 is set to "L" level, and a writing data input Din is set to "H" level. In this state, the level of the input signal of the word line driving circuit 92 is changed from "H" to "L." Thereby, if the word line WL1 is in "H" level and the MOS transistors T11 and T12 for transfer gate is turned on, the first storage node b1 is discharged to VSS level, and the second storage node a1 is charged to the level of VDD–Vt11 (Vt11: threshold voltage of MOS transistor T11). In other words, "H" level data is written to the second storage node a1.

Moreover, the second storage node a1 is charged from the VDD node through a high resistor R11, and boosted to a VDD level in a routine state. However, such charging is performed by the high resistor R11 and a time constant of electrostatic capacity of the second storage node a1, and several ms to several tens ms are normally needed. Due to this, such charging is little helpful to the write operation.

Then, writing is ended, the word line driving circuit 92 is in a non-driving state, the word line WL1 is in VSS level, and the MOS transistors T11 and T12 are turned off. Thereafter, data is stored in the memory cell by electric charge Qa1=Ca1·Va1=Ca1·VDD–Ca1·Vt11, which is stored by voltage Va1 of the second storage node a1 and electrostatic capacity Ca1 of the second storage node a1.

By the way, in a case where radioactive rays, particularly α ray, emitted from radioactive material contained in the material constituting an SRAM package and SRAM is inputted to a semiconductor substrate, an electron is generated in the substrate. If the electron reaches an "H" level data storage node (second storage node a1 of this example), there is generated the so-called soft error in which the electron recombines with a positive electric charge whereby the electric charge Qa1 is lost and storage data of the memory cell 91 cannot be stored.

In order to reduce the generation of the soft error, the electric charge Qa1 stored in the second storage node a1 of the memory cell 91 may become extremely large. As a main electrostatic capacity Ca1 of the storage node a1, there are junction capacitance between the substrate and diffusion layers of the MOS transistor T11 and the MOS transistor T13, and a capacitance between the gate and the channel of the MOS transistor T14. The electrostatic capacity Ca1 may be increased to increase the electric charge Qa1.

However, in recent years, the memory cell has been miniaturized and the transistor has been small-sized in accordance with the highly integrated SRAM whose capacity is enlarged. As a result, in the present circumstances, electrostatic capacity of the storage nodes a1 and b1 has become smaller and smaller.

Moreover, Va1 can be increased to increase the electric charge Qa1. However, for the reason of low power consumption of SRAM, a gate breakdown voltage is decreased since a thickness of a gate oxide film is reduced in accordance with the miniaturization of the transistor. As a result, VDD tends to be lowered. Due to this, the voltage of "H" level data storage node is also lowered. Particularly, the voltage of "H" level data storage node is reduced to VDD— VTH11 (VTH11: threshold voltages of MOS transistor T11) when the writing operation is ended.

Due to this, in the highly integrated SRAM whose capacity is enlarged, the soft error generation rate is increased, and particularly, the soft error is remarkably generated in the memory cell just after the writing operation is ended.

In order to solve the above problem, as shown in FIG. 13, it is considered that a word line boosting circuit 131, which is used in DRAM, and a word line driving circuit 132 using an output of the word line boosting circuit are used.

FIG. 14 shows an example of an operation waveform of the circuit of FIG. 13.

In the word line boosting circuit 131 of FIG. 13, capacitor C having a high value is charged to VDD by a precharge circuit 133, and after a row decoder output /WL has been established (a low level), a node SV is transited from 0 V to VDD level. Whereby, a voltage, which is higher than VDD, is generated at a node WLV. Moreover, due to the rise of the voltage of the node WLV, a node G to which a gate of an NMOS transistor TA for word line driving of the word line driving circuit 132 is increased to the level, which is higher than VDD, by a capacity combination between the gate of the transistor TA and the channel. Then, the boosting level of the node G is maintained by an NMOS transistor TB, so that a voltage, which is higher than VDD, is outputted to the word line WL.

As mentioned above, the "H" level voltage, which is higher than VDD, is outputted to the word line WL, thereby making it possible to compensate for voltage drop corresponding to the threshold of the transfer gate for transferring data between the bit line and the data strange node of the memory cell.

Whereby, the "H" level voltage of the "H" level data storage node is increased when "H" level data writing is ended, and the electric charge to be stored in the storage node is increased by the value corresponding to the increased voltage. As a result, stability of storage data of the memory cell is increased, and the soft error generation rate is reduced.

As mentioned above, increase in the word line voltage can be considered as measures against the soft error generated just after the writing is ended. However, in this case, the boosting circuit 131 is needed to increase the word line voltage to be more than the power supply voltage, and the number of wirings of the boosting circuit 131 is increased. Due to this, there is generated a problem in that the manufacturing cost is increased.

Moreover, there is a limitation in the driving capability of a driver circuit (not shown) for driving the node SV, and the capacity value of capacitor C cannot be unnecessarily increased. Therefore, since power, which the boosting circuit output node WLV can supply, is not so large, it is difficult to drive the word line WL having a high wiring load by the above-mentioned circuit system.

Furthermore, in the boosting circuit 131 of FIG. 13, the input of the node SV must be controlled to be synchronized with an output /WL of a row decoder 134 in order to precharge capacitor C. Due to this, the above-mentioned system cannot be realized by SRAM having no synch signal.

As mentioned above, in the conventional SRAM there was the problem of difficulty in reducing the soft error generation rate caused by the incidence of the radioactive rays just after the writing to the storage node of the SRAM cell.

SUMMARY OF THE INVENTION

In consideration of the above-mentioned problems, an object of the present invention is to provide a semiconductor memory device wherein resistance of storage data to incidence of radioactive rays is increased just after writing to a storage node of a memory cell is ended, and a soft error generation rate can be easily reduced.

According to the present invention, there is provided a semiconductor memory device comprising a substrate bias voltage generation circuit for outputting a substrate bias voltage higher than a power supply voltage supplied from an outer unit to the semiconductor memory device; a memory cell array having memory cells arranged in a matrix form; a word line connected to the memory cells on the same row of the memory cell array; and a word line driving circuit having a PMOS transistor to output "H" level to the word line at the time of selecting the word line, wherein an output bias voltage of the substrate bias generation circuit is supplied to an N type substrate region of the PMOS transistor of the word line driving circuit to bias the N type substrate region to the bias voltage and to a power supply terminal of the word line driving circuit as a power supply voltage.

In addition to the use of the output voltage of the substrate bias voltage generation circuit to bias the voltage of the semiconductor substrate and increase a potential of the word line, the output voltage is applied to the substrate region of the PMOS transistor for word line driving, and used as a power source of the PMOS transistor. Whereby, the voltage of "H" level data becomes higher than the conventional case just after writing to the storage node of the memory cell is ended, so that the charge stored in the storage node is increased by the amount, which corresponds to the increase in the voltage of the "H" level data.

Therefore, resistance of storage data to incidence of radioactive rays is considerably increased just after writing to the storage node of the memory cell is ended, stability of storage data of the memory cell is improved, and the soft error generation rate is reduced.

In the case, the output voltage of the substrate bias voltage generation circuit having high current drive capability can be supplied to all PMOS transistors for word line driving in common. Also, it is unnecessary to newly add a dedicated circuit such as a word line boosting circuit. Therefore, it is possible to control the increase in the size of the chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will be explained with reference to the drawings.

Figure 1:
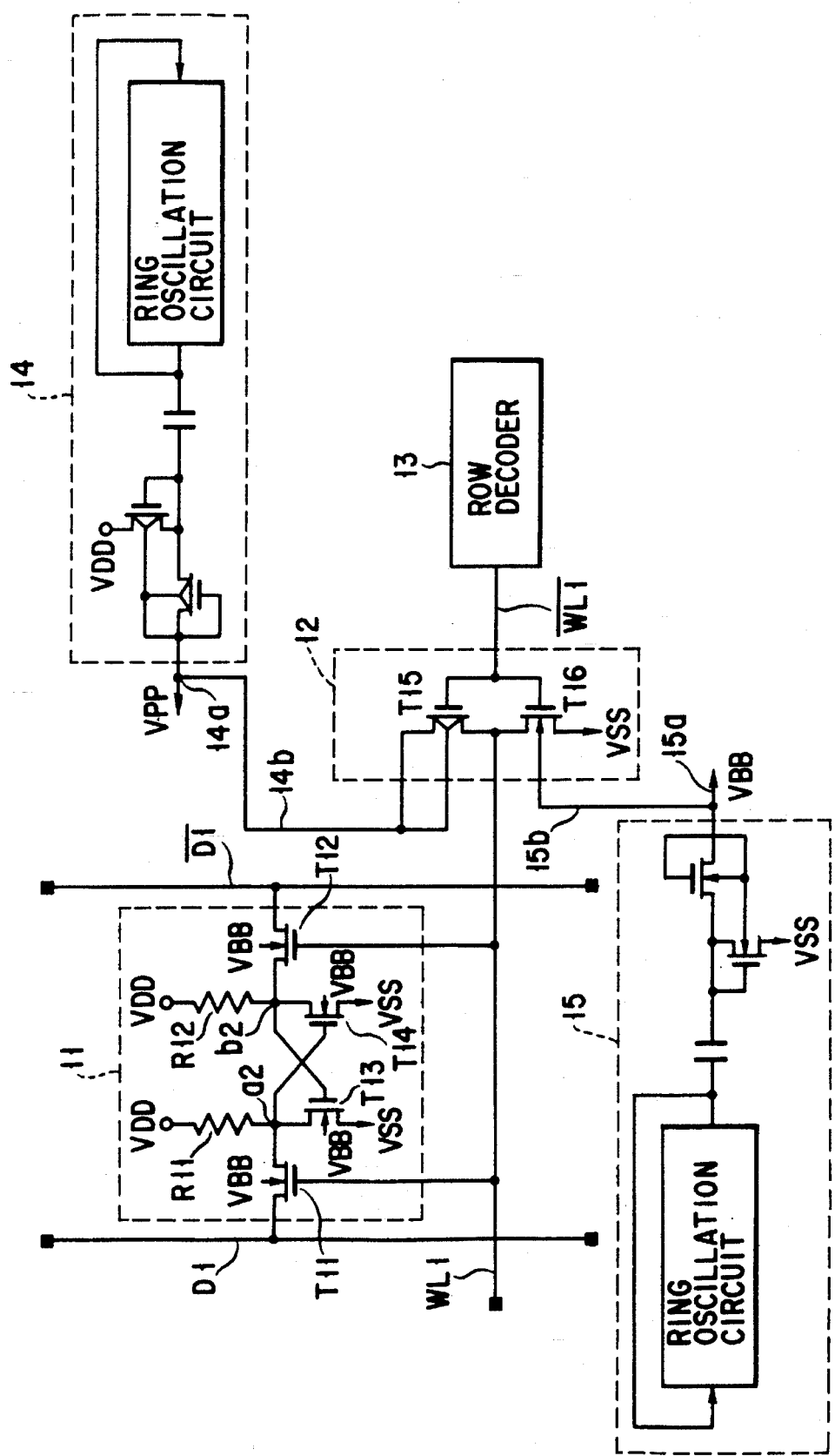
FIG. 1 is a circuit diagram showing a part of an SRAM of a first embodiment of the present invention.

FIG. 1 shows a part of an SRAM using a memory cell of a first embodiment of the present invention.

In FIG. 1, reference numeral 11 is an SRAM, which structures a memory cell array having a plurality of cells arranged in a matrix form (not shown). The SRAM 11 comprises a flop-flop circuit having two inverters cross-connected, and a pair of MOS transistors for a transfer gate. Two inverters comprises enhancement type MOS transistors T13 and T14 for driving and high resistors R11 and R12 for load. One end of each of the MOS transistors T11 and T12 is connected to each of a pair of complementary storage nodes a2 and b2 of the flip-flop circuit.

D1 and /D show a pair of bit lines, which are connected in common to the plurality of SRAM cells 11 (only one cell is shown in the figure) in the same column of the memory cell array. Each of the bit lines D1 and /D1 is connected to each of the other end of the MOS transistors T11 and T12 for transfer gate.

WL1 is a word line, which is connected in common to each gate of the MOS transistors T11 and T12 for transfer gate of SRAM cells 11 (only one cell is shown in the figure) in the same row of the memory cell array.

Each of the MOS transistors T11 and T12 for transfer gate is turned on or off in accordance with a logic level of the word line WL1, and data transfer among the storage node a2 of the flip-flop circuit, the bit line D1, the storage node b2, and the bit line /D1 is controlled.

Reference numeral 12 is a word line driving circuit comprising a CMOS (complementary MOS) inverter having a PMOS transistor T15 for driving the word line WL1 and an NMOS transistor T16 for pulling down the voltage of the word line WL1 to a ground voltage (VSS).

Reference numeral 13 is a row decoder for decoding a row address to drive the word line driving circuit 12.

Reference numeral 14 is a first substrate bias voltage generation circuit for generating a substrate bias voltage VPP of a positive polarity. Reference numeral 14a is a first substrate bias power line for supplying the output voltage of the first substrate bias generation circuit 14 to a predetermined N type region of the semiconductor substrate.

Reference numeral 15 is a second substrate bias voltage generation circuit for generating a substrate bias voltage VBB of a negative polarity. Reference numeral 15a is a second substrate bias power line for supplying the output voltage of the second substrate bias generation circuit 15 to a predetermined N type region of the semiconductor substrate.

Reference numeral 14b is a first wiring for connecting an operation node of the CMOS inverter 12 (source of PMOS transistor T15 in this embodiment) and the substrate region of the PMOS transistor T15 to the first substrate bias power line 14a. Reference numeral 15b is a second wiring for connecting the substrate region of the PMOS transistor T16 of the CMOS inverter 12 to the second substrate bias power line 15a.

Figure 2:
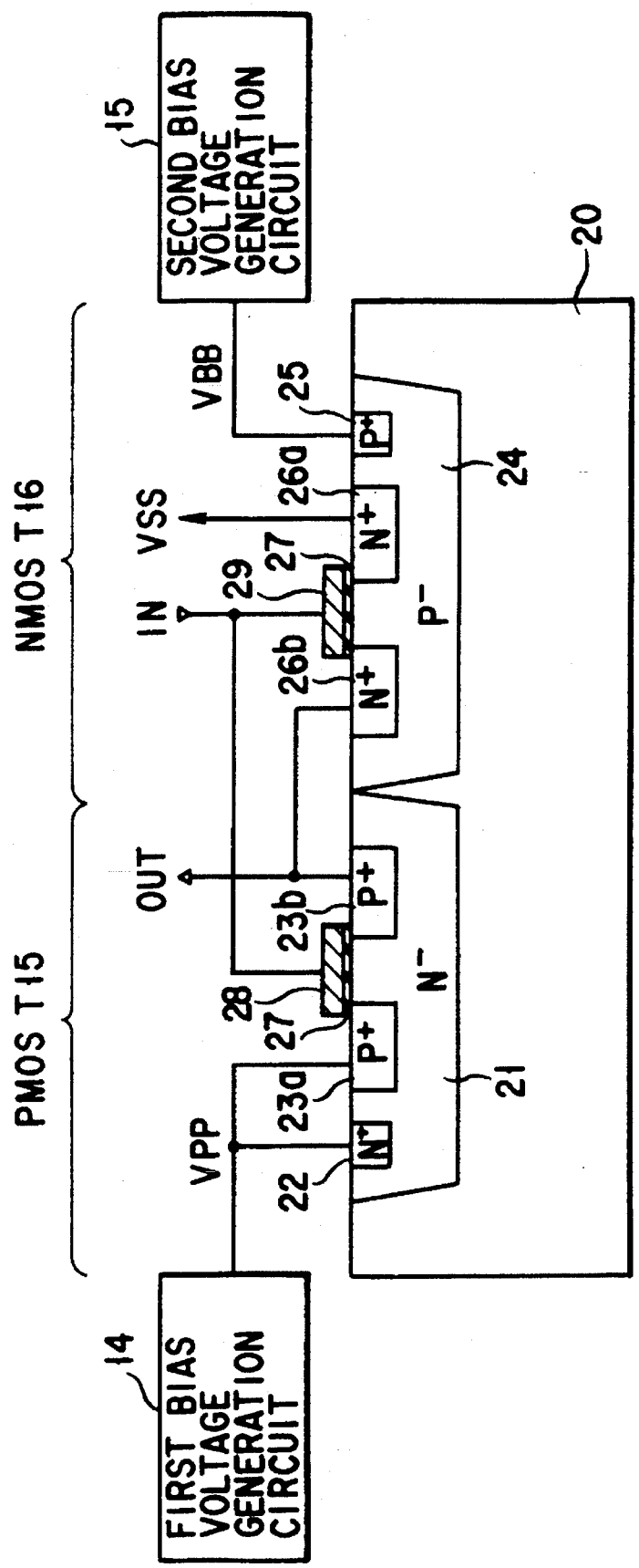
FIG. 2 is a cross sectional view showing an example of both transistors of a CMOS inverter of FIG. 1.
Figure 12:
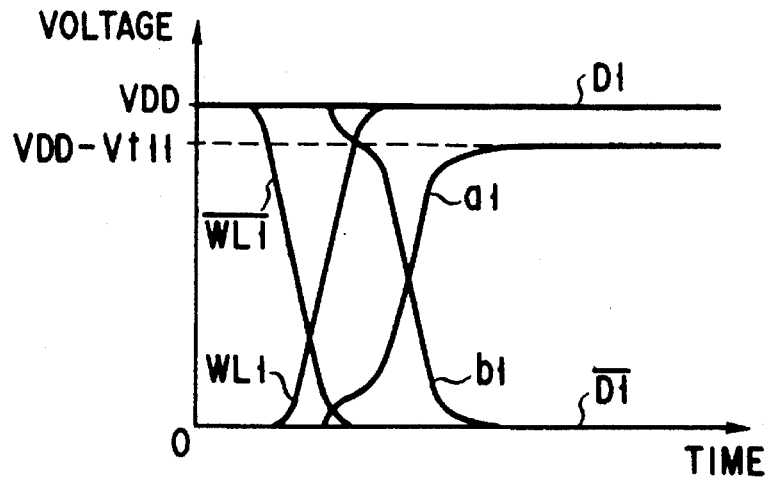
FIG. 12 is a view showing an example of a voltage waveform of each node in a writing operation to the memory cell of FIG. 9.
Figure 13:
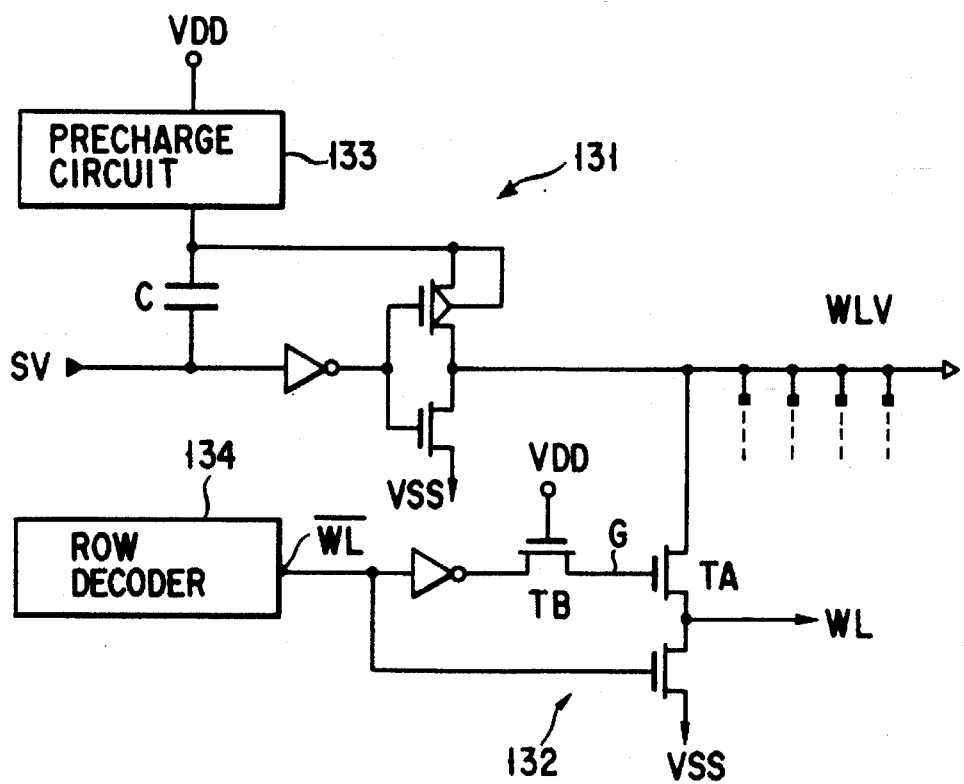
FIG. 13 is a circuit diagram showing an example of a word line booting circuit used in a DRAM, and a word line driving circuit.
Figure 14:
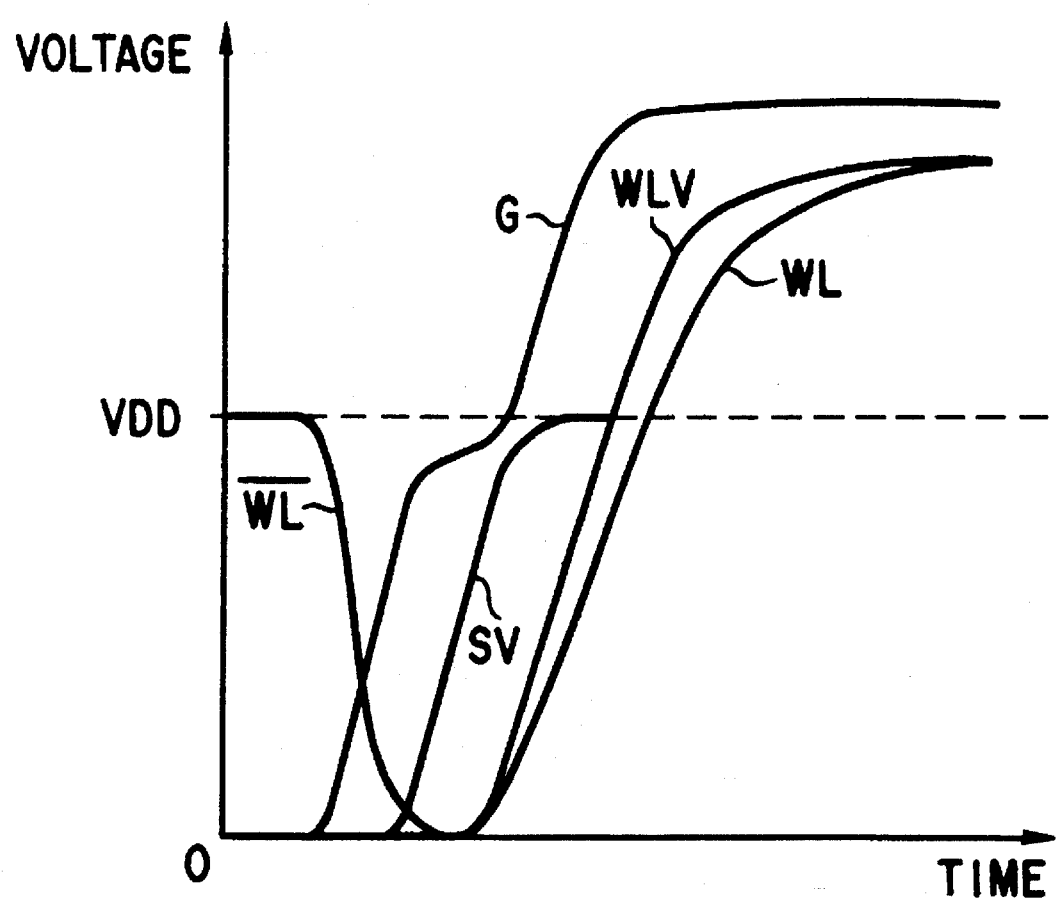
FIG. 14 is a view showing an example of a voltage waveform of each node in an example of the operation of the circuit of FIG. 13.

FIG. 2 shows an example of a cross sectional structure of each of transistors T15 an T16 of the CMOS inverter circuit 12 of FIG. 12.

In FIG. 2, reference numeral 20 is a semiconductor substrate, 21: an N⁻ type N well (substrate region of PMOS transistor T15), 22: an N⁺ type electrode region of N well 21, 23a, 23b: P⁺ type impurity regions (source and drain of PMOS transistor T15, respectively), 24: a P⁻ type P well (substrate region of NMOS transistor T16), 25: a P⁺ type electrode region of P well, 26a, 26b: N⁺ type impurity regions (source and drain of NMOS transistor T16, respectively), 27: an insulation gate film formed on the substrate surface), 28: a gate electrode of PMOS transistor T15),and 29: a gate electrode of NMOS transistor T16.

The gate of the PMOS transistor 15 and that of the NMOS transistor T16 are mutually connected to each other, and serve as an input (IN) node, and the node of the PMOS transistor 15 and that of the NMOS transistor T16 are mutually connected to each other, and serve as an output (OUT) node. Then, a reference voltage node of the CMOS inverter 12 (source 26a of NMOS transistor T16 in this embodiment) is connected to a VSS node.

Moreover, the first substrate bias voltage VPP is supplied from the first substrate bias voltage generation circuit 14 to the N+ type electrode region of N well 21 and the operation node of the CMOS inverter 12 (source 23a of PMOS transistor T15 in this embodiment). The second substrate bias voltage VPP is supplied from the second substrate bias voltage generation circuit 15 to the P+ type electrode region 25 of the P well 24.

According to the SRAM of the above-mentioned embodiment, the second substrate bias voltage VBB, which is lower than VSS (or becomes high in a negative voltage direction), is added to the substrate region (P well) of the NMOS transistor T16 of the CMOS inverter 12 for a word line driving. Whereby, unlike the conventional case in which VSS is added to the P well 24, the PN junction between the drain of the NMOS transistor T16 and the substrate is strongly biased in a reverse direction, and a depletion layer between the drain and the substrate is largely widened, and parasitic capacity of the drain can be reduced.

Figure 3:
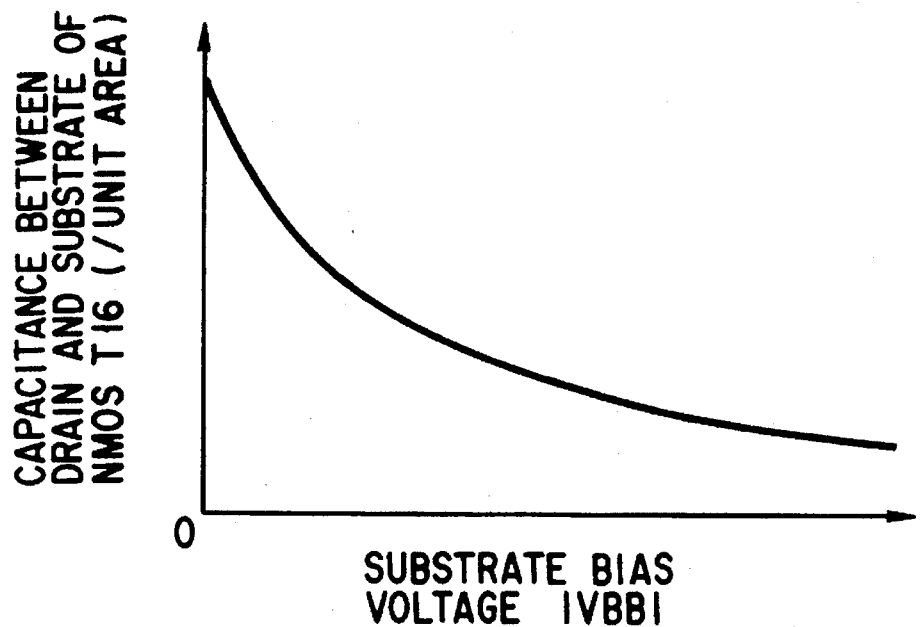
FIG. 3 is a characteristic view showing a relationship between an absolute value of a substrate bias voltage of an NMOS transistor of the CMOS inverter of FIG. 1 and capacitance between a drain and the substrate per unit area.

FIG. 3 shows a relationship between an absolute value of the substrate bias voltage VBB of the NMOS transistor T16 and capacitance between the drain and the substrate per unit area.

As is obvious from the characteristic view, the larger the substrate bias VGG (absolute value) becomes, the more capacitance between the drain of the NMOS transistor T16 and the substrate is reduced. Moreover, since the PN junction between the drain and the substrate is biased in the reverse direction, the PN junction between the drain and the substrate is not easily biased in the reverse direction even if there occurs over shoot of a signal in the drain. In other words, the generation of the so-called latch up can be prevented.

Furthermore, according to SRAM of the above-mentioned embodiment, there is used the new technique in which parasitic capacity of the PMOS transistor is reduced and the substrate voltage VPP, which is higher than VDD, is also added to the N type substrate of the PMOS transistor in order to improve a high speed operation. Moreover, the N type substrate bias voltage is used as a power source of the PMOS transistor for a word line driving.

In other words, the first substrate bias voltage VPP is added to both the N$^+$type substrate region (N well) 22 of the N well 21 of the CMOS inverter 12 for a word line driving and the operation power node of the CMOS inverter 12 (source 23a of the PMOS transistor T15 in this embodiment).

Moreover, the CMOS inverter 12 for a word line driving a "H" level signal of the voltage VPP, which is higher than the power supply voltage VDD to be supplied to the SRAM cell or the other circuits, is outputted to the word line WL1. Whereby, it is possible to compensate for voltage drop corresponding to the threshold of the transfer gates T11 and T12 for controlling data transfer between the bit lines D1, /D and the memory cell storage nodes a2, b2.

In the above-mentioned embodiment of the present invention, the following expressions can be established among VPP, VDD, threshold voltages VTHN of MOS transistors T11 and T12 for a transfer gate, and the absolute value |VTHP| of the threshold voltages of the PMOS transistor T15 of the CMOS inverter:

$$VTHN \ll |VTHP| \qquad (1)$$

$$VDD+VTHN \leq VPP < VDD+|VTHP| \qquad (2)$$

In other words, the first substrate bias voltage VPP is higher than the power supply voltage VDD by the threshold voltage VTHN of the MOS transistors T11 and T12 for transfer gate of the SRAM cell or more. Also, the first substrate bias voltage VPP is lower than the sum of the power supply voltage VDD and the absolute value |VTHP| of the threshold voltage of the PMOS transistor T15 of the MOS inverter.

Figure 4:
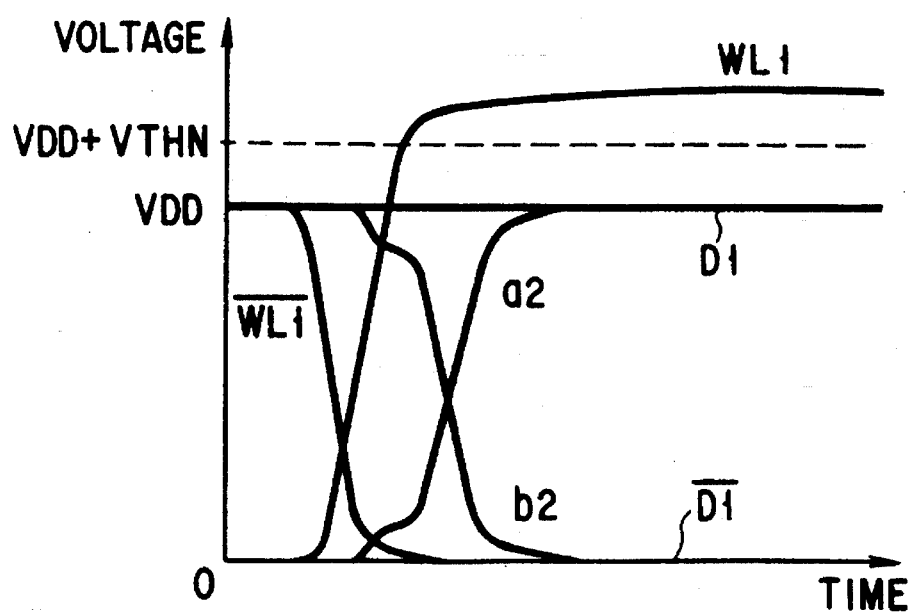
FIG. 4 is a view showing an example of a waveform of each node in a writing operation to the SRAM cell of FIG. 1.

FIG. 4 shows an example of a waveform of each node in a writing operation to the SRAM cell 11 of FIG. 1.

Figure 11:
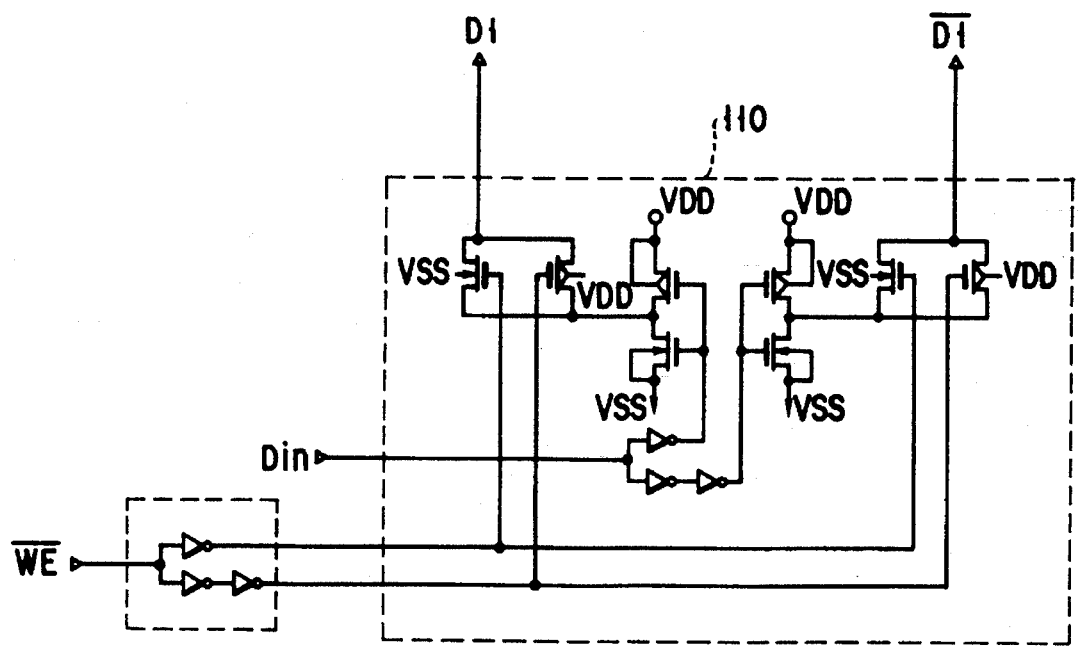
FIG. 11 is a circuit diagram showing an example of a writing buffer for writing data to a pair of bit lines.

A writing buffer circuit for writing data to the bit lines D1 and /D1 (not shown in FIG. 1) is provided as shown in, for example, FIG. 11.

Similar to the explanation of the writing operation of the prior art, it is assumed that the pair of storage nodes a2 and b2 of the flip-flop circuit of the memory cell are set to the "L" level (VSS) and /"H" level (VDD), respectively, in the initial state of the writing operation to the SRAM cell 11. Under this state, the writing enable signal /WE to be inputted to the writing buffer circuit is set to "L" level, the writing data input Din is set to "H" level (VDD), the the bit line D1 is set to VDD, and the bit line /D1 is set to VSS.

At this time, if the input signal of the CMOS inverter 12 is changed from "H" level to "L" level, the word line WL1 is set to be in the "H" level, which is higher than the voltage of (VDD+VTHN) so that the MOS transistors T11 and T12 for transfer gate are turned on. Whereby, the first storage node b2 is charged up to VSS level, and the voltage VDD of the bit line D1 is transmitted without receiving voltage drop due to the MOS transistor T11 for transfer gate, so that the second storage node a2 is charged to VDD level ("H" level data is written).

Then, when the writing operation is ended, the word line driving circuit 12 is in a non-selective state, the word line WL1 is in VSS level, and the MOS transistors T11 and T12 for transfer gate are set to be in an off state, the voltage of the second storage node a2 is already set to be VDD level. Due to this, storage data of the memory cell is stored by the electric charge Qa2 (=Ca2·VDD), which is stored by electrostatic capacity Ca2 of the second storage node a2.

It is assumed that the electrostatic capacity Ca2 of the second storage node a2 is equal with the electrostatic capacity a1 of the conventional second storage node a1 (Ca2=Ca1=C) in order to compare with the conventional writing operation. The electric charge Qa2 (Ca2·VDD), which is stored in the second storage node a2, is more than the electric charge Qa1 (=Ca1·VDD−Ca1·VTH), which is stored in the second storage node a1 when the conventional writing operation is performed, by Ca2·VTH, and this can be expressed by the following equation:

$$Qa2 = Qa1 + C \cdot VTH \qquad (3)$$

Therefore, according to the SRAM of the above-mentioned embodiment of the present invention, the "H" level voltage of the storage node a2, which is obtained when the writing operation is ended, becomes higher than the conventional case. Then, the electric charge Qa2 stored in the storage node a2 is increased by the amount, which corresponds to the increase in the "H" level voltage of the storage node a2. As a result, stability of storage data of the memory cell can be improved, and the soft error generation rate can be reduced.

In other words, in the SRAM of the above-mentioned first embodiment of the present invention, the output voltage VPP of the first substrate bias generation circuit 14 is applied to the the operation power supply node of the CMOS inverter 12 for word line driving and the substrate region 21 of the PMOS transistor T15 in addition to the original use for biasing the voltage of the semiconductor substrate. Whereby, resistance of storage data to incidence of radioactive rays is considerably increased just after writing to the "H" level data storage node of the SRAM cell 11 is ended, and the soft error generation rate can be easily reduced.

In the above-mentioned embodiment, the output voltage of the substrate bias voltage generation circuit 14 having high current drive capability can be supplied to the PMOS transistor operation power supply nodes of all CMOS inverters 12 for word line driving (only only inverter is typically shown in FIG. 1) and the substrate region in common. Also, it is unnecessary to newly add a dedicated circuit such as a word line boosting circuit. Therefore, it is possible to control the increase in the size of the chip.

Figure 5:
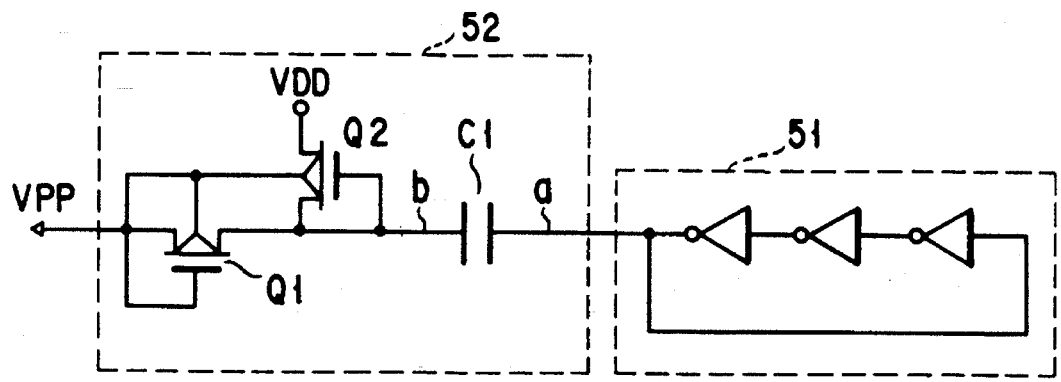
FIG. 5 is a circuit diagram showing an example a first substrate bias voltage generation circuit of FIG. 1.
Figure 6:
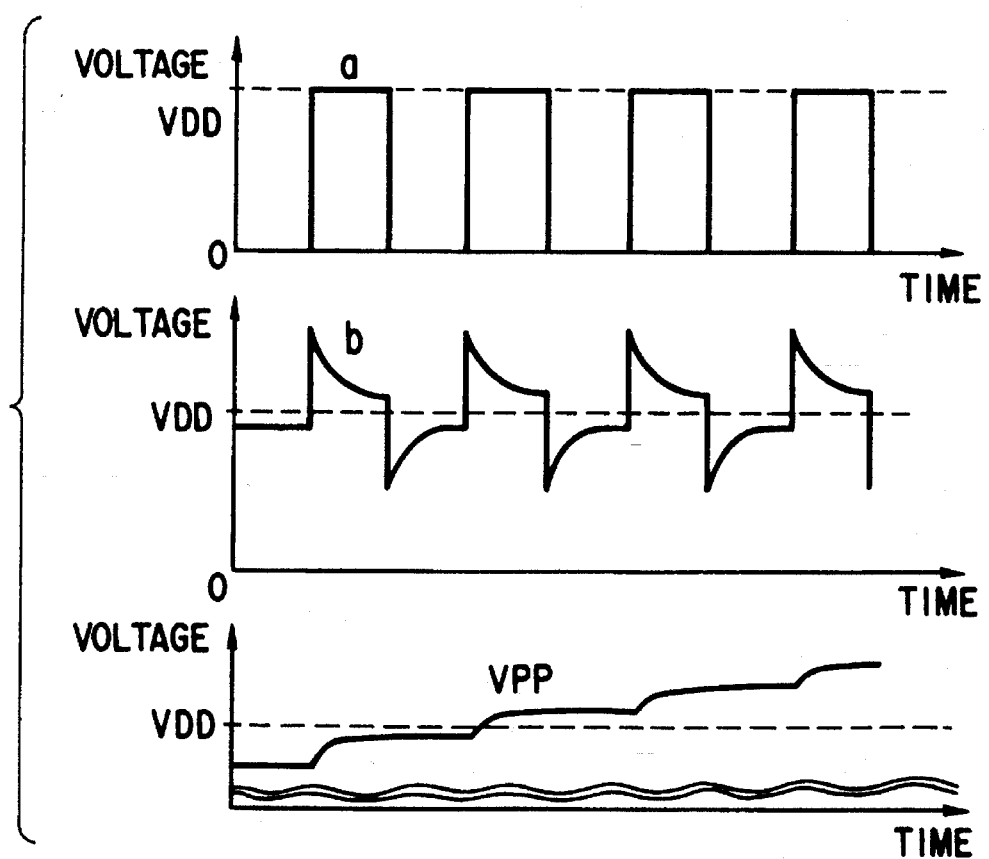
FIG. 6 is a waveform view showing an example of an operation of the circuit of FIG. 5.

FIG. 5 shows an example of the first substrate bias voltage generation circuit 14 of FIG. 1, and an example of a waveform of the main node at the time of the operation is shown in FIG. 6.

As is known, the substrate bias voltage generation circuit 14 comprises a power supply circuit having a ring oscillation circuit 51 and a charge pump circuit 52 using capacitor C1 and diode-connected PMOS transistors Q1 and Q2, and the operation is performed as shown in FIG. 6.

Power supply capability of the output voltage VPP of the power supply circuit is proportional to the product of an oscillation frequency f of the ring oscillation circuit 51, capacity C1 of capacitor of the charge pump circuit 52, and the voltage amplitude Va of the oscillation circuit output node a.

In a case where the power supply circuit is used as the first substrate bias voltage generation circuit 14, capacity, which the semiconductor substrate itself has, is generally much larger than capacity C1 of capacitor of the charge pump circuit 52. However, the ring oscillation circuit 51 starts the oscillation operation at the same time with the power supply of SRAM, and continuously supplies power to the substrates. Then, charging to the substrate is completed in several m seconds when SRAM is set to be in an operation standby state.

As one large advantage, which can be obtained by using the N type substrate bias output as the operation power supply of the word line driving circuit 12, the following point can be explained:

More specifically, electrostatic capacity, which the N type substrate has, is much larger than capacity of the word line WL1, which is driven by the word line driving circuit 12. Due to this, the above power supply circuit, that is, the substrate bias generation circuit 14 can be sufficiently used in the memory having the word line having large capacity load.

It is noted that the structure of the second substrate bias voltage generation circuit 15 of FIG. 1 is substantially the same as that of the first substrate bias voltage generation circuit 14 (the difference therebetween is that the NMOS transistor is used in the charge pump circuit and that VSS, serving as the reference voltage, is applied thereto).

Figure 7:
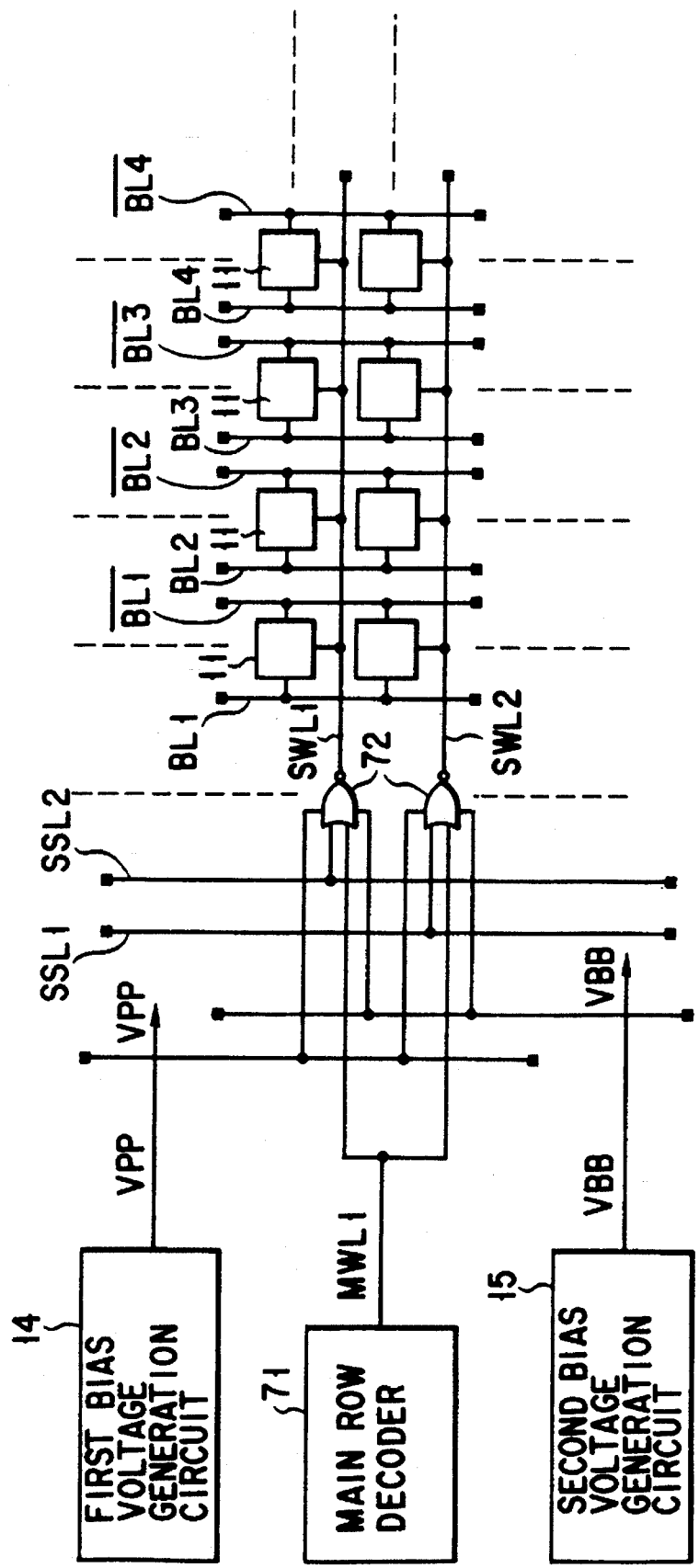
FIG. 7 is a circuit diagram showing a part of a SRAM of a dividing word line system of a second embodiment of the present invention.

FIG. 7 shows a part of an SRAM of a dividing word line system of a second embodiment of the present invention including an example in which the present invention is applied to a CMOS NOR circuit for driving a section word line.

In FIG. 7, reference numeral 71 is a main row decoder, MWL1: a main word line, SSL1 and SSL2: section decoder output signal lines, 72: a CMOS NOR circuit for driving a section word line, 14, 15: the first and second substrate bias generation circuits, which are the same as those used in the first embodiment, SWL1 and SWL2: section word lines, (BL1, /BL) to (BL4, /BL4): pairs of bit lines, and 11: SRAM cells shown in FIG. 1.

Figure 8:
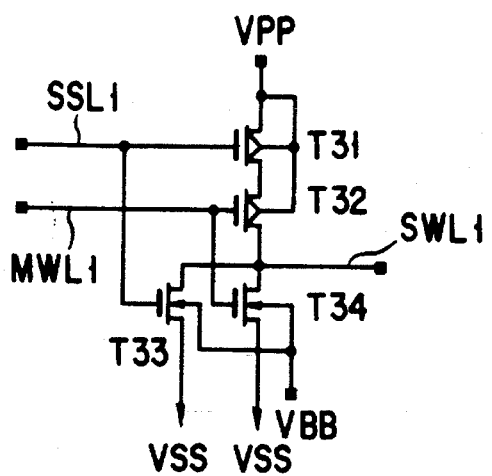
FIG. 8 is a circuit diagram showing an example of a CMOS NOR circuit for driving a section word line of FIG. 7.
Figure 9:
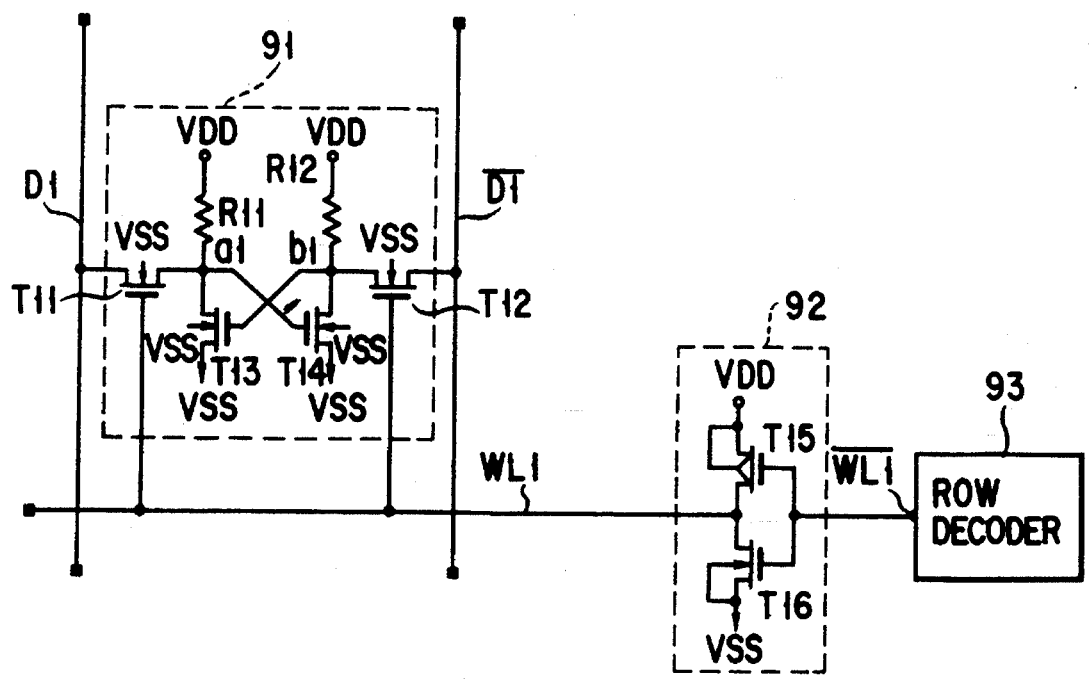
FIG. 9 is a circuit diagram showing a part of the conventional SRAM using an E/R type memory cell array.
Figure 10:
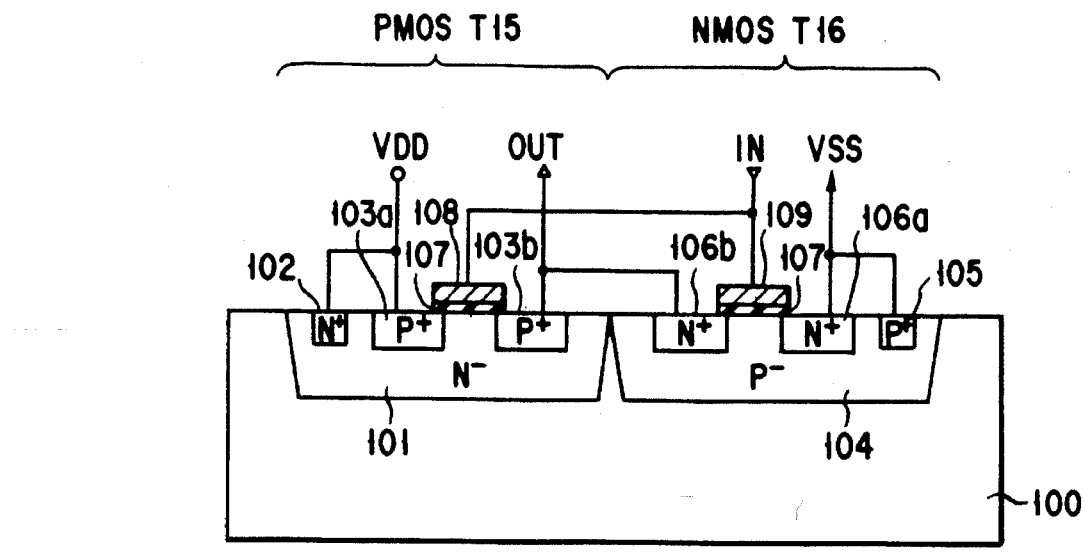
FIG. 10 is a cross sectional view showing the structure of both transistors of a CMOS inverter of FIG. 9.

FIG. 8 shows an example of the CMOS NOR circuit 72 for driving a section word line of FIG. 7.

In the NOR circuit 72, two PMOS transistors T31 and T32 are connected in series between the operation power supply node and the output node, and two NMOS transistors T33 and T34 are connected in series between the output node and the VSS node. The voltage of the section decoder output signal line (e.g. SSL1) is applied to each gate of the PMOS transistor T31 and the NMOS transistor T33. The voltage of the main word line MWL1 is applied to each gate of the PMOS transistor 32 and the NMOS transistor T34. Then, the first substrate bias voltage VPP is supplied to the operation power supply node and the substrate regions of two PMOS transistors T31 and T32. The second substrate bias voltage VBB is supplied to the substrate regions of two NMOS transistors T33 and T34.

The following expression, which is the same as the expression (2) can be established among the substrate bias voltage VPP, the power supply voltage VDD, threshold voltages VTHN of MOS transistors T11 and T12 for a transfer gate, and the absolute value |VTHP| of the threshold voltages of the PMOS transistors T31 and T32 of the CMOS NOR circuit 72

$$VDD+VTHN \leq VPP < VDD+|VTHP| \quad (4)$$

Therefore, in the SRAM of the second embodiment, the same advantage as the SRAM of the first embodiment can be obtained from the operation based on the operation of SRAM of the first embodiment.

The above embodiments showed the case of SRAM. However, the present invention can be applied to the other semiconductor memory device such as DRAM.

As mentioned above, according to the present invention, there can be realized a semiconductor memory device wherein resistance of storage data to incidence of radioactive rays is increased just after writing to a storage node of a memory cell is ended, and a soft error generation rate can be easily reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:

a substrate bias voltage generation circuit for outputting a substrate bias voltage higher than a power supply voltage supplied from an outer unit to said semiconductor memory device;

a memory cell array having memory cells arranged in a matrix form;

a word line connected to the memory cells on the same row of said memory cell array; and a word line driving circuit including a CMOS inverter constituted of a PMOS transistor and an NMOS transistor, the PMOS transistor for outputting "H" level to said word line at the time of selecting said word line, wherein an output bias voltage of said substrate bias generation circuit is supplied to an N type substrate region of said PMOS transistor of said word line driving circuit to bias the N type substrate region to the bias voltage and supplied to a power supply terminal of said word line driving circuit as a power supply voltage.

2. The device according to claim 1, wherein each of said memory cells comprises a flip-flop circuit having two inverters formed of an enhancement type MOS transistor for driving and a high resistance element for a load, the inverters cross-connected to each other, and a pair of MOS transistors for a transfer gate; and wherein one end of the respective enhancement type MOS transistors is connected to each of a pair of complementary storage nodes of said flip-flop circuit.

3. The device according to claim 2, wherein the substrate bias voltage generated by said substrate bias generation circuit is higher than the power supply voltage supplied from the outer unit of the semiconductor memory device by a threshold voltage of each of said MOS transistor for a transfer gate of said SRAM cell or more.

4. The device according to claim 2, wherein the substrate voltage generated by said substrate bias generation circuit is lower than the sum of the power supply voltage supplied from the outer unit of the semiconductor memory device and an absolute value of the threshold voltage of said PMOS transistor of said word line driving circuit.

5. The device according to claim 1, wherein a source of said PMOS transistor of said word line driving circuit is connected to a substrate bias voltage output terminal of said substrate bias voltage generation circuit.

* * * * *